United States Patent
Nakamura et al.

(10) Patent No.: US 9,473,108 B2
(45) Date of Patent: Oct. 18, 2016

(54) SURFACE ACOUSTIC WAVE DEVICE AND FILTER

(71) Applicant: TAIYO YUDEN CO., LTD., Tokyo (JP)

(72) Inventors: Kentaro Nakamura, Tokyo (JP); Hidetaro Nakazawa, Tokyo (JP); Shogo Inoue, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 43 days.

(21) Appl. No.: 14/482,272

(22) Filed: Sep. 10, 2014

(65) Prior Publication Data
US 2015/0123746 A1    May 7, 2015

(30) Foreign Application Priority Data

Nov. 1, 2013   (JP) ................. 2013-228241

(51) Int. Cl.
| | |
|---|---|
| *H03H 9/64* | (2006.01) |
| *H03H 3/08* | (2006.01) |
| *H03H 3/02* | (2006.01) |
| *H03H 9/02* | (2006.01) |

(52) U.S. Cl.
CPC ............. *H03H 9/6489* (2013.01); *H03H 3/08* (2013.01); *H03H 9/02818* (2013.01)

(58) Field of Classification Search
CPC ...... H03H 3/08; H03H 9/02818; H03H 9/25; H03H 9/64; H03H 9/725; H03H 9/6489; H01L 41/047
USPC .......... 333/133, 193–196; 310/313 B, 313 D
See application file for complete search history.

(56) References Cited

U.S. PATENT DOCUMENTS

| | | | |
|---|---|---|---|
| 7,965,155 B2 * | 6/2011 | Nakamura | H03H 9/02858 310/313 B |
| 2002/0057036 A1 | 5/2002 | Taniguchi et al. | |
| 2004/0251990 A1 | 12/2004 | Ueda et al. | |
| 2012/0161577 A1 | 6/2012 | Abbott et al. | |

FOREIGN PATENT DOCUMENTS

| | | |
|---|---|---|
| JP | 2002-100952 A | 4/2002 |
| JP | 2004-328196 A | 11/2004 |
| JP | 2007-110342 A | 4/2007 |
| JP | 2009-278429 A | 11/2009 |
| JP | 2012-186808 A | 9/2012 |

* cited by examiner

*Primary Examiner* — Benny Lee
*Assistant Examiner* — Jorge Salazar, Jr.
(74) *Attorney, Agent, or Firm* — Chen Yoshimura LLP

(57) ABSTRACT

A surface acoustic wave device includes: a pair of comb-like electrodes formed on a piezoelectric substrate, each of which includes electrode fingers, dummy electrode fingers and a bus bar to which the electrode fingers and the dummy electrode fingers are connected, the electrode fingers and the dummy electrode fingers of one of the pair of comb-like electrodes facing the dummy electrode fingers and the electrode fingers of the other com-like electrode, respectively; and additional films extending in the form of a strip in a first direction in which the electrode fingers are arranged side by side, each of the additional films covering at least parts of gaps defined by ends of the electrode fingers of one of the pair of comb-like electrodes and ends of the dummy electrode fingers of the other comb-like electrode.

13 Claims, 20 Drawing Sheets

SECOND
DIRECTION

FIRST
DIRECTION

SURFACE ACOUSTIC WAVE DEVICE AND FILTER

CROSS-REFERENCE TO RELATED APPLICATION

This application is based upon and claims the benefit of priority of the prior Japanese Patent Application No. 2013-228241, filed on Nov. 1, 2013, the entire contents of which are incorporated herein by reference.

FIELD

A certain aspect of the present invention relates to a surface acoustic wave device and a filter.

BACKGROUND

As an acoustic wave device utilizing an acoustic wave, there is known a surface acoustic wave (SAW) device that includes an interdigital transducer (IDT) including a pair of comb-like electrodes on a piezoelectric substrate, and a pair of reflectors between which the IDT is interposed on the piezoelectric substrate. The SAW device is used in bandpass filters in various circuits that process wireless signals in the frequency range of 45 MHz to 2 GHz, which is typically used in cellular phones. In recent years, with improvements in the performance of wireless communication devices, which are typically cellular phones (for example, multi-band or multi-mode performance), it has been demanded to reduce the insertion loss of the filters for the purpose of improving the receiver sensitivity of the wireless communication devices and reducing the power consumption.

There have been various proposed acoustic devices intended to reduce the power consumption of the filters. For example, there has been a proposed structure in which part of a bus bar is thicker than electrode fingers (see Japanese Patent Application Publication Nos. 2002-100952 and 2004-328196, for example). Another structure has been proposed in which a protection film that covers the IDT is relatively thick except a part in which electrode fingers are interleaved (see Japanese Patent Application Publication No. 2007-110342, for example). There has been yet another proposal of widening end parts of electrode fingers or adding a metal film or the like to end parts (see Japanese Patent Application Publication No. 2012-186808, for example). There has been a further proposal of a structure in which an insulator is buried between an electrode finger and a bus bar or between an electrode finger and a dummy electrode (see Japanese Patent Application Publication No. 2009-278429, for example).

However, in the conventional acoustic devices, there is yet room for improvement in the reduction of the insertion loss.

SUMMARY OF THE INVENTION

According to an aspect of the present invention, there is provided a surface acoustic wave device including: a pair of comb-like electrodes formed on a piezoelectric substrate, each of which includes electrode fingers, dummy electrode fingers and a bus bar to which the electrode fingers and the dummy electrode fingers are connected, the electrode fingers and the dummy electrode fingers of one of the pair of comb-like electrodes facing the dummy electrode fingers and the electrode fingers of the other comb-like electrode, respectively; and additional films extending in the form of a strip in a first direction in which the electrode fingers are arranged side by side, each of the additional films covering at least parts of gaps defined by ends of the electrode fingers of one of the pair of comb-like electrodes and ends of the dummy electrode fingers of the other comb-like electrode.

According to another aspect of the present invention, there is provided a surface acoustic wave device including: a pair of comb-like electrodes formed on a piezoelectric substrate, each of which includes electrode fingers and a bus bar to which the electrode fingers are connected, the electrode fingers of one of the pair of comb-like electrodes facing the bus bar of the other comb-like electrode; and additional films extending in the form of a strip in a first direction in which the electrode fingers are arranged side by side, each of the additional films covering at least parts of gaps defined by ends of the electrode fingers of one of the pair of comb-like electrodes and a side of the bus bar of the other comb-like electrode.

According to a further aspect of the present invention, there is provided a filter that includes any of the above surface acoustic wave devices.

DETAILED DESCRIPTION

Figure 1A:
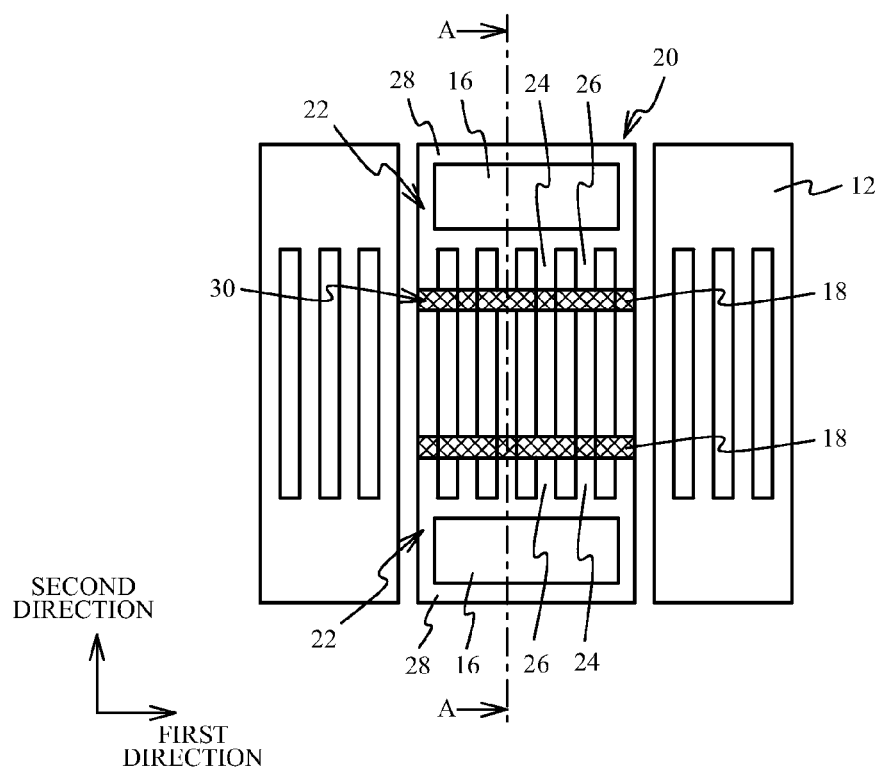
FIG. 1A is a top view of a SAW device in accordance with a first embodiment.
Figure 1B:
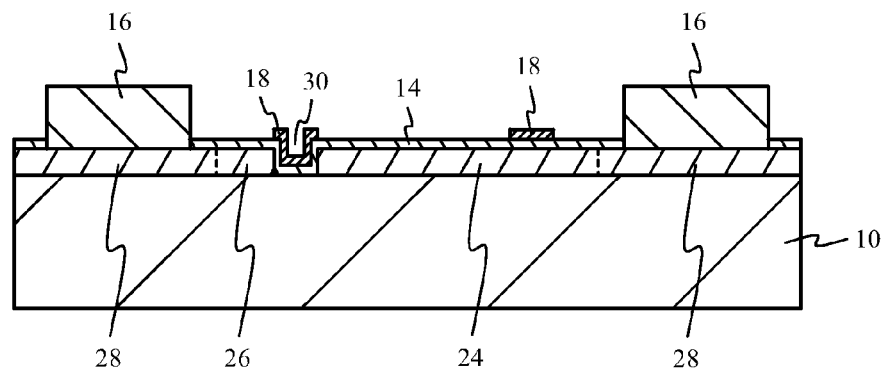
FIG. 1B is a cross-sectional view taken along a line A-A in FIG. 1A.

A description is now given of embodiments of the present invention in conjunction with the accompanying drawings.
First Embodiment FIG. 1A is a top view of a SAW filter device in accordance with a first embodiment, and FIG. 1B is a cross-sectional view taken along a line A-A in FIG. 1A. The view of FIG. 1A is seen through a protective film 14. Referring to FIGS. 1A and 1B, on a piezoelectric substrate 10, provided are an IDT 20 and reflectors 12 provided at opposite sides of the IDT 20 in the direction of propagation of the acoustic waves. The piezoelectric substrate 10 may be formed by using a piezoelectric substance such as lithium niobate or lithium tantalate. The IDT 20 and the reflectors 12 may be formed of a metal such as aluminum or copper. The IDT 20 includes a pair of comb-like electrodes 22. Each of the pair of comb-like electrodes 22 includes multiple electrode fingers 24, multiple dummy electrode fingers 26, and bus bars 28 that interconnect the corresponding electrode fingers 24 and dummy electrode fingers 26. The dummy electrode fingers 26 are arranged between the electrode fingers 24. The electrode fingers 24 of the pair of comb-like electrodes 22 are interleaved.

A protective film 14 covers the IDT 20 and the reflectors 12 except parts of the bus bars 28. The protective film 14 may be a dielectric film made of silicon oxide, for example. The protective film 14 is as thick as approximately ⅒ of the IDT 20, for example. Metal films 16 are provided on the parts of the bus bars 28 that are not covered by the protective film 14.

The ends of the electrode fingers 24 of one of the paired comb-like electrodes 22 face the ends of the dummy electrode fingers 26 of the other comb-like electrode 22 through gaps 30. The protective film 14 that covers the IDT 20 is buried in the gaps 30. Additional films 18 having a strip shape are provided so as to cover the gaps 30 and extend in a first direction in which the multiple electrode fingers 24 are arranged side by side. The additional films 18 may be thinner than the protective film 14. The first embodiment has an exemplary structure in which the additional films 18 extend from one of the outermost electrode fingers 24 of the pair of the comb-like electrodes 22 to the other one. The exemplary structure has the additional films 18 that cover the gaps 30 but do not overlie the electrode fingers 24 and the dummy electrode fingers 26 located at the opposite sides of the gaps 30 in a second direction in which the electrode fingers 24 extend. The additional films 18 may be a film that includes, for example, any of tantalum oxide, aluminum oxide, silicon oxide, silicon nitride, aluminum nitride, silicon carbide, titanium oxide, silicon and diamond, or a metal film that includes, for example, any of titanium (Ti), gold (Au), copper (Cu), chromium (Cr), nickel (Ni), platinum (Pt), tantalum (Ta), tungsten (W), ruthenium (Ru) and molybdenum (Mo).

Figure 2A:
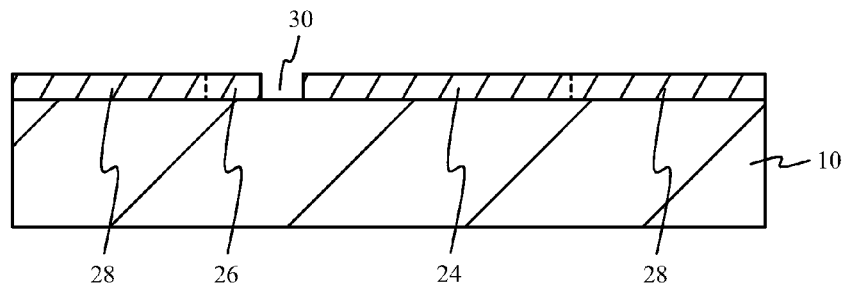
FIGS. 2A through 2D are cross-sectional views that illustrate a first method for fabricating the SAW device of the first embodiment.

A description is now given of a method for fabricating the SAW device according to the first embodiment. FIGS. 2A, 2B, 2C, 2D, 3A, 3B, and 3C are cross-sectional views that illustrate a first method for fabricating the SAW device of the first embodiment. Referring to FIG. 2A, a metal film is formed on the piezoelectric substrate 10, and is processed by the exposure and etching techniques to thus form the IDT 20 including the paired comb-like electrodes 22 composed of the electrode fingers 24, the dummy electrode fingers 26 and the bus bars 28 and the reflectors 12. The gaps 30 are formed between the ends of the electrode fingers 24 and the ends of the dummy electrode fingers 26.

Figure 2B:
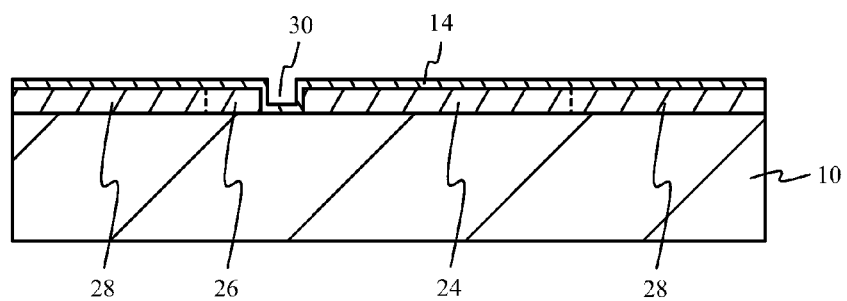
Figure 2C:
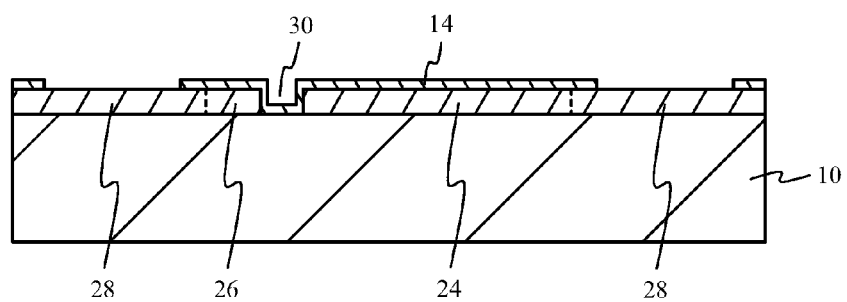
Figure 2D:
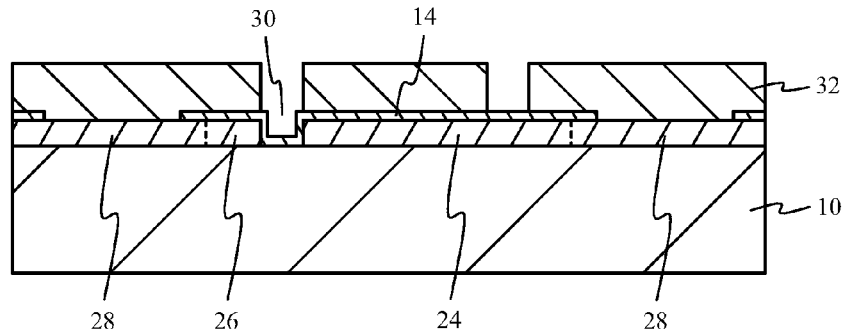

Referring to FIG. 2B, the protective film 14 is formed on the whole surface by sputtering, for example. Referring to FIG. 2C, parts of the protective film 14 in which the metal films 16 are to be formed are removed by the exposure and etching techniques, for example. Referring to FIG. 2D, a resist film 32 is formed on the whole surface, and openings are formed by removing the resist film 32 in areas in which the additional films 18 are to be formed.

Figure 3A:
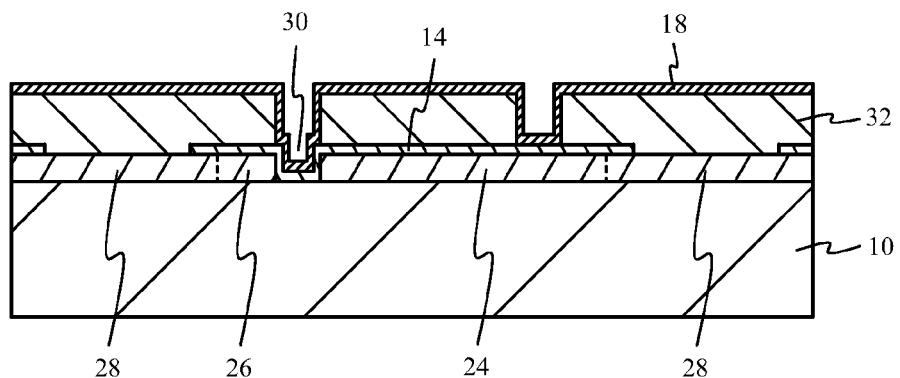
FIGS. 3A through 3C are cross-sectional views that illustrate steps of the first method that follow the steps of FIGS. 2A through 2D.
Figure 3B:
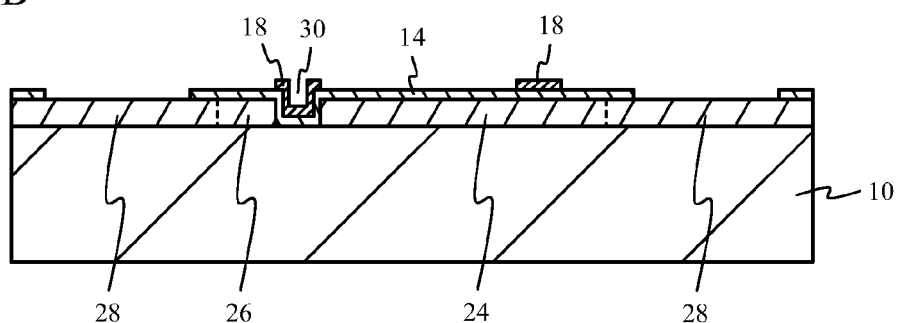
Figure 3C:
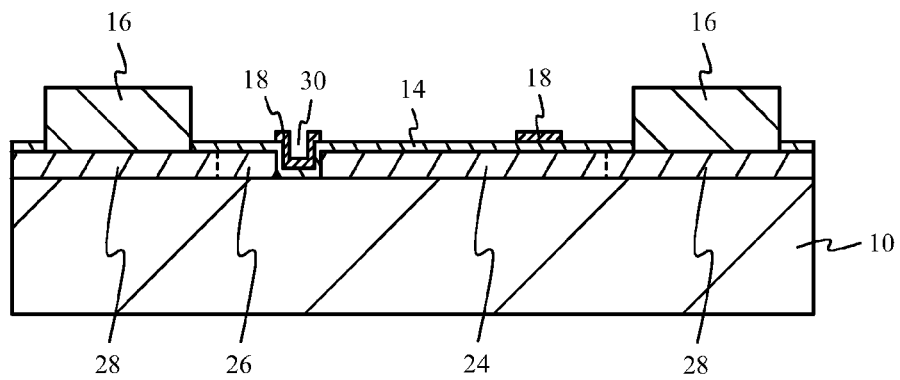

Referring to FIG. 3A, a film which is to be patterned into the additional films 18 is deposited on the entire surface by sputtering, for example. Referring to FIG. 3B, the resist film 32 is removed by liftoff whereby the additional films 18 are formed. Since the additional films 18 are formed by the propose based on the lithography technique, the additional films 18 and the gaps 30 are positioned with an accuracy of at least 0.1 μm. It is thus possible to achieve a controlled quantity of coverage of the additional films 18 for the electrode fingers 24 and the dummy electrode fingers 26. Referring to FIG. 3C, the metal films 16 are formed on the bus bars 28 by vapor deposition and liftoff, for example. The SAW device is fabricated by the process including the above steps.

Figure 4A:
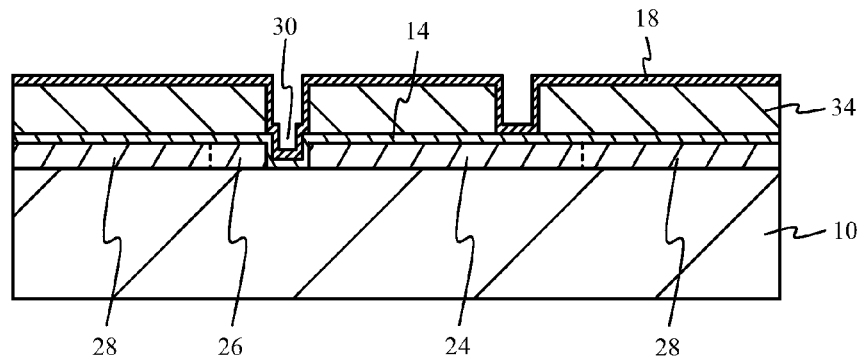
FIGS. 4A through 4D are cross-sectional views that illustrate a second method for fabricating the SAW device of the first embodiment.
Figure 4B:
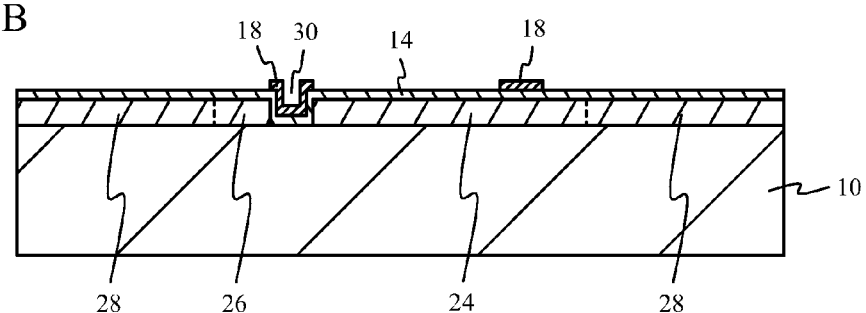

FIGS. 4A through 4D are cross-sectional views that illustrate a second method for fabricating the SAW device according to the first embodiment. After the protective film 14 is deposited on the whole surface by performing the steps of FIGS. 2A and 2B, as illustrated in FIG. 4A, formed is a resist film 34 having openings located in positions where the additional films 18 are to be formed. Then, the film which is to be patterned into the additional films 18 is deposited on the whole surface by sputtering. Referring to FIG. 4B, the film is patterned into the additional films 18 by removing the resist film 34 by liftoff.

Figure 4C:
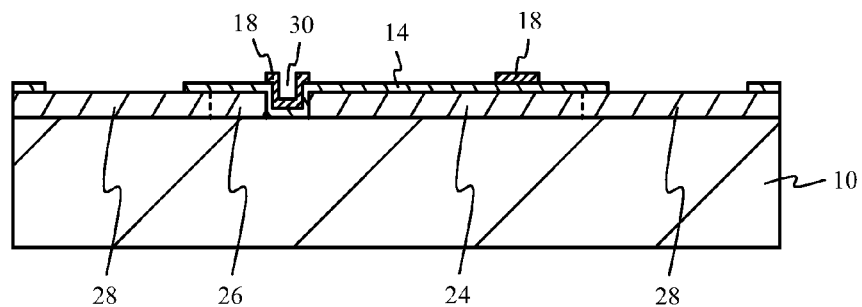
Figure 4D:
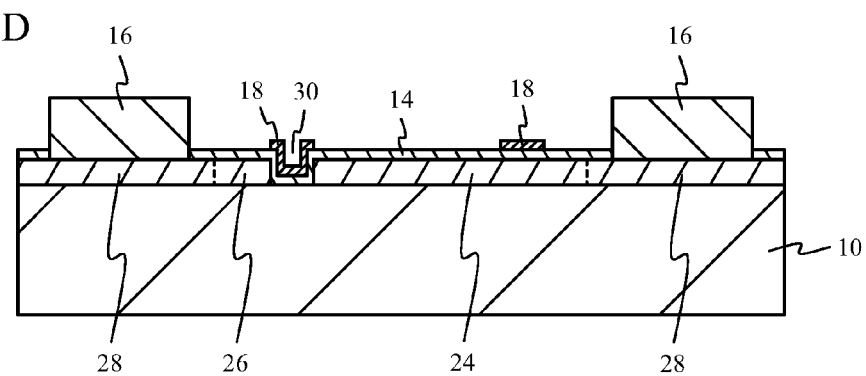

Referring to FIG. 4C, the protective film 14 is removed, by the exposure and etching techniques, in areas in which the metal films 16 are to be formed. Referring to FIG. 4D, the metal films 16 are formed on the bus bars 28 by vapor deposition and liftoff. The SAW device is fabricated by the process including the above steps of the second fabrication method.

Figure 5A:
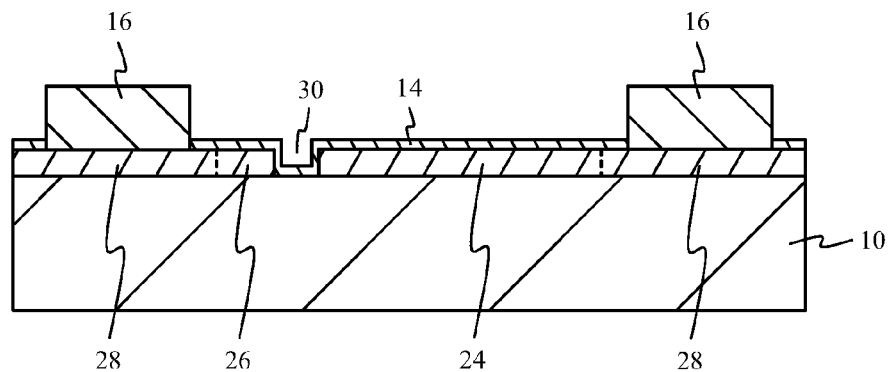
FIGS. 5A through 5C are cross-sectional views that illustrate a third method for fabricating the SAW device of the first embodiment.
Figure 5B:
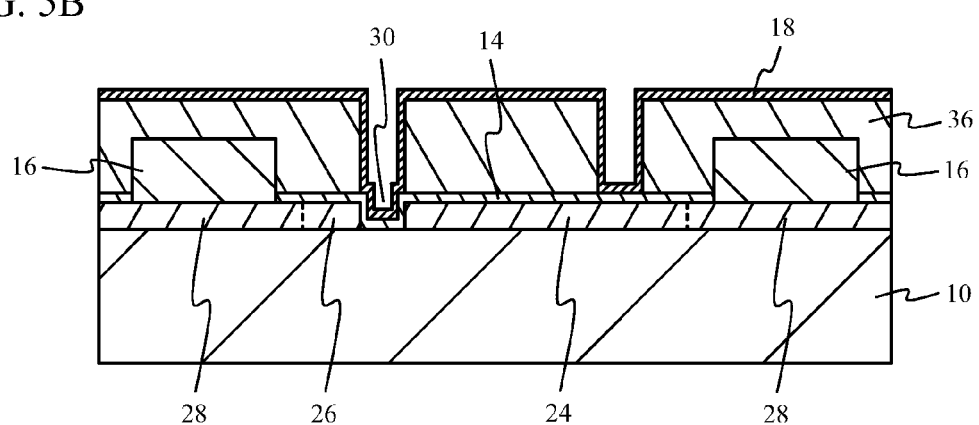
Figure 5C:
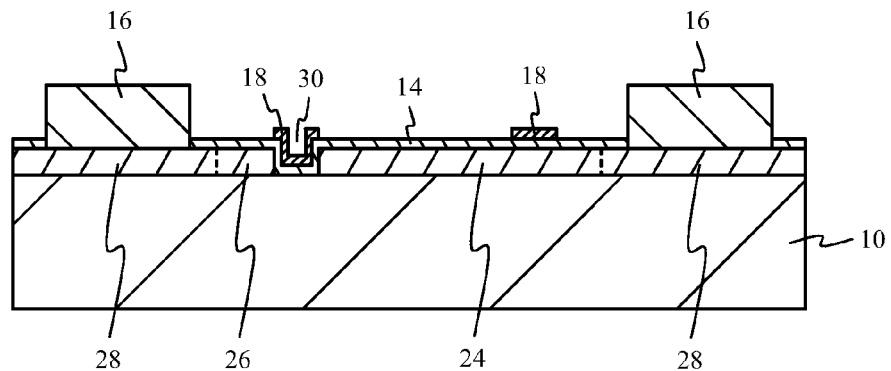

FIGS. 5A through 5C are cross-sectional views that illustrate a third method for fabricating the SAW device according to the first embodiment. A step illustrated in FIG. 5A follows the series of steps of FIGS. 2A through 2C through which the protective film 14 is removed in the areas in which the metal films 16 are to be formed. In FIG. 5A, the metal films 16 are formed on the bus bars 28 by vapor deposition and liftoff.

Referring to FIG. 5B, a resist film 36 having openings in areas in which the additional films 18 are to be formed is formed. Then, a film that is to be patterned into the additional films 18 is deposited on the whole surface by sputtering, for example. Referring FIG. 5C, the resist film 36 is removed by liftoff whereby the additional films 18 are formed. The SAW device of the first embodiment is fabricated by the process including the above steps of the third fabrication method.

Figure 6:
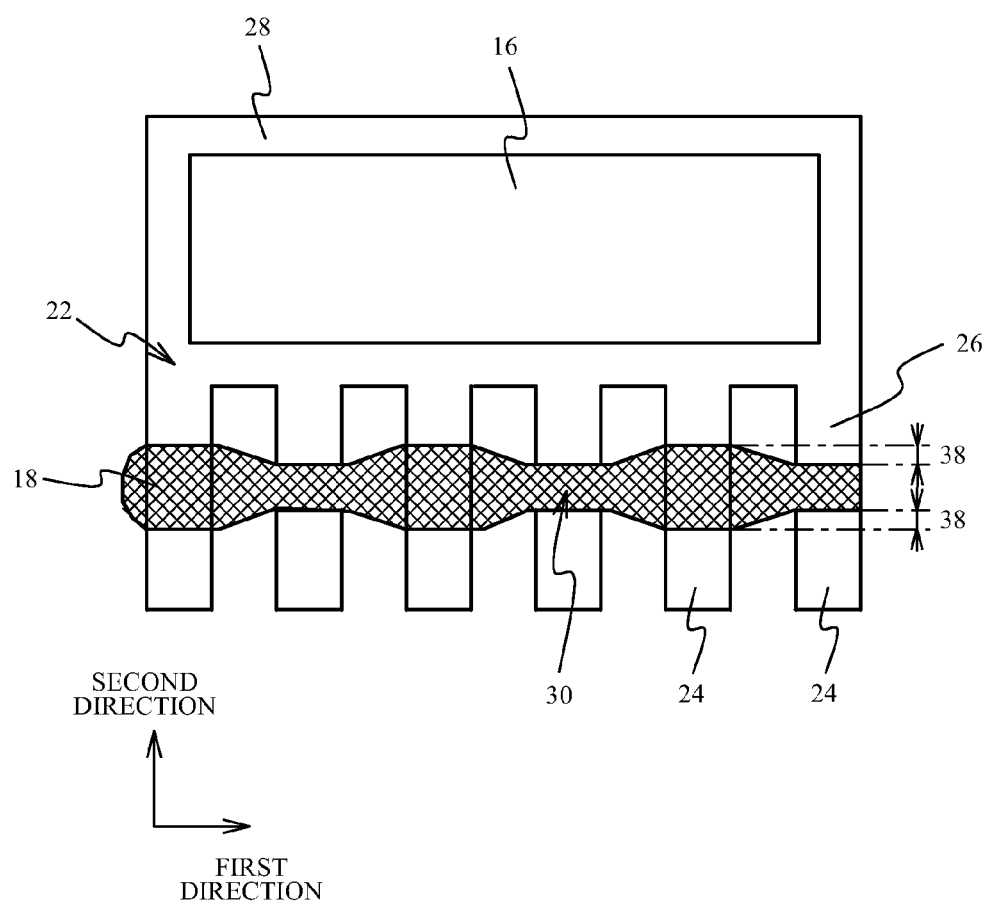
FIG. 6 is a schematic top view of a SAW device of the first embodiment actually fabricated.

FIG. 6 is a schematic top view of a SAW device actually fabricated according to the first embodiment. FIG. 6 depicts only part of the upper surface of the SAW device. In some cases, parts of additional film 18 on the electrode fingers 24 adjacent to the gaps 30 in the first direction are thicker than parts thereof formed in the gaps 30. As will be described later with reference to FIGS. 15C through 15E, there is another case where the additional films 18 have a constant width. Now, an overlap length 38 is defined as lengths of the additional film 18 measured from the ends of the electrode fingers 24 and those of the dummy electrode fingers 26 to the opposite ends of the additional film 18 in the second direction. In other words, the overlap length 38 corresponds to distances between the ends of the gaps 30 in the second direction and the ends of the additional film 18 in the second direction.

A description is now given of an experiment conducted by the inventors. The inventors produced the SAW device of the first embodiment, and measures the admittance characteristic, the radiation conductance characteristic and the Q characteristic thereof. The specification of the SAW device produced is shown in Table 1.

TABLE 1

| Piezoelectric substrate | 42° rotated Y-cut LiTaO$_3$ |
|---|---|
| IDT & reflectors | Al 193 nm |
| Protective film | SiO$_2$ 20 nm |
| Additional films | Ta$_2$O$_5$ 6 nm |
| Wavelength λ of acoustic waves | 2 μm |
| Number of pairs of electrode fingers | 116 pairs |
| Number of electrode fingers of each reflector | 40 |
| Duty ratio | 50% |
| Length of gaps | 0.175λ |
| Length of dummy electrode fingers | 2.0λ |

As indicated in Table 1, the piezoelectric substrate 10 is a 42° rotated Y-cut LiTaO$_3$ substrate. The IDT 20 and the reflectors 12 are an aluminum film that is 193 nm in thickness. The protective film 14 is a silicon oxide (SiO$_2$) film having a thickness of 20 nm, and the additional films 18 are tantalum oxide (Ta$_2$O$_5$) films having a thickness of 6 nm.

The wavelength λ of the acoustic waves excited by the SAW device is 2 μm. The number of pairs of electrode fingers 24 of the IDT 20 is 116, and the number of electrode fingers of each reflector 12 is 40. The duty ratio of the electrode fingers 24 and the dummy electrode fingers 26 is 50%. The length of the gaps between the electrode fingers 24 and the dummy electrode fingers 26 is 0.175λ where λ is the wavelength of SAW. The length of the dummy electrode fingers 26 is 2.0λ.

Figure 7:
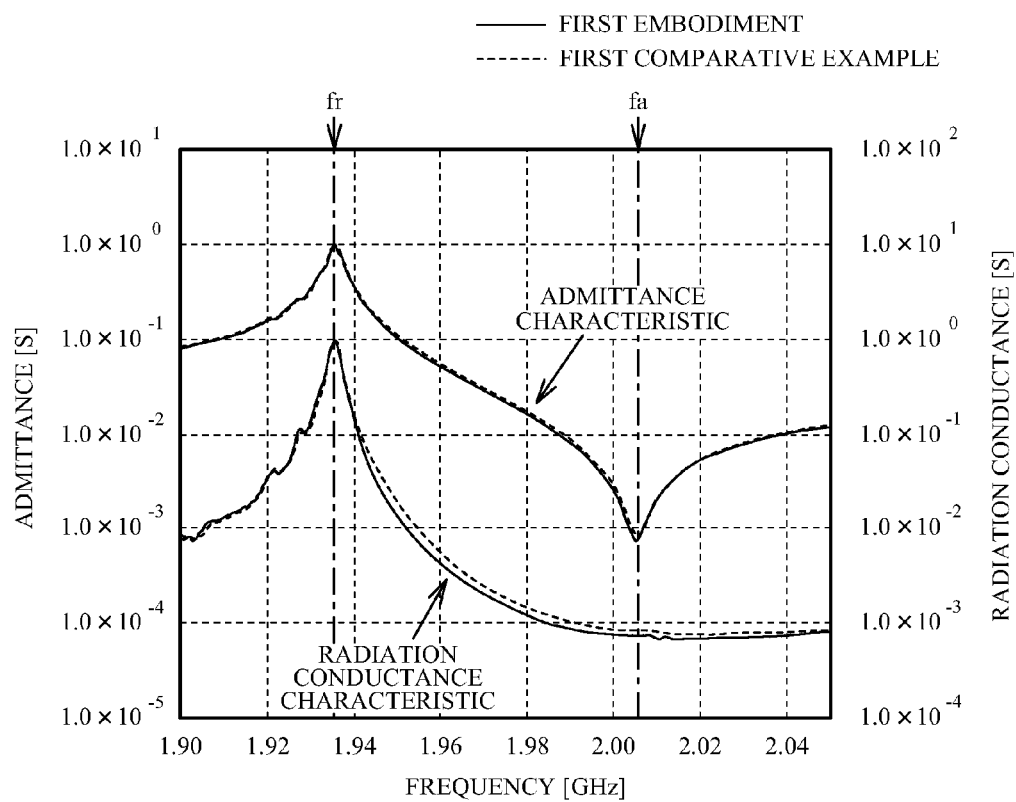
FIG. 7 is a graph of measurement results of the admittance characteristic and the radiation conductance characteristic of the SAW device of the first embodiment.

FIG. 7 illustrates a measurement result of the admittance characteristic and the radiation conductance characteristic of the SAW device of the first embodiment. Solid lines are measurement results of the first embodiments. Dotted lines are measurement results of a first comparative example that is the same as the SAW device except that the comparative example does not have the additional films 18. As illustrated in FIG. 7, there is little difference in the admittance characteristic between the first embodiment and the first comparative example. In contrast, the radiation conductance characteristic of the first embodiment is lower than that of the first comparative example in the range of a resonance frequency fr to an anti-resonance frequency fa.

Figure 8:
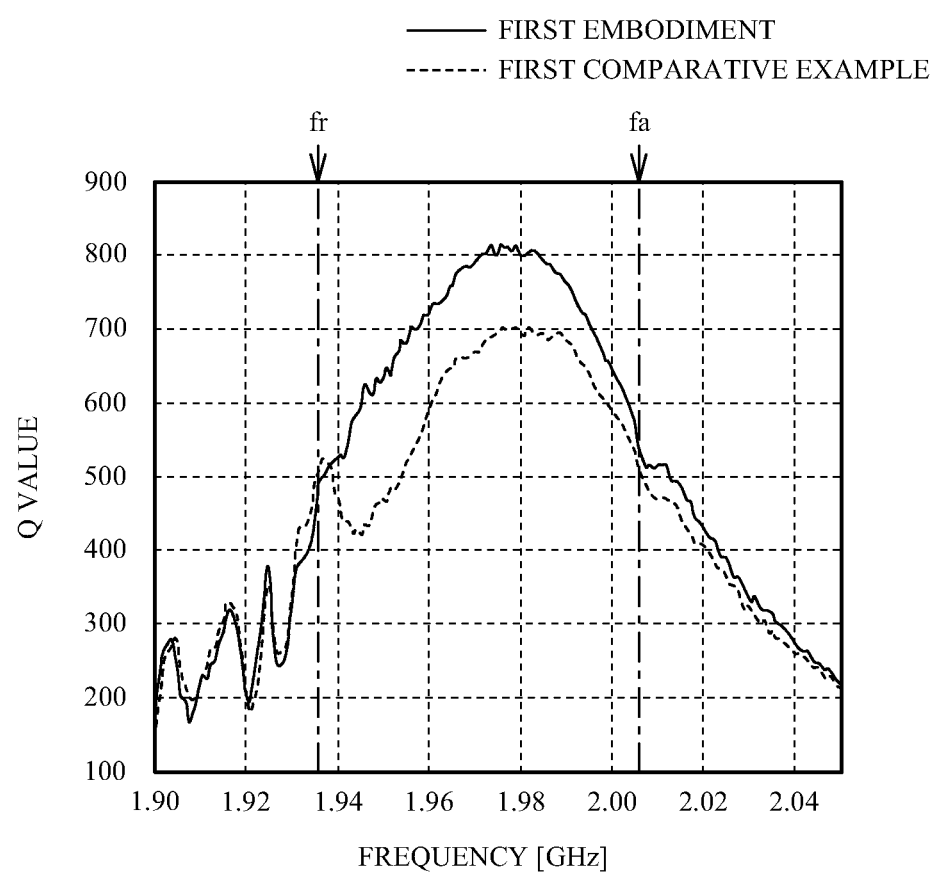
FIG. 8 is a graph of a measurement result of the Q characteristic of the SAW device of the first embodiment.

FIG. 8 illustrates a measurement result of the Q characteristics of the SAW device of the first embodiment and the first comparative example. As illustrated in FIG. 8, the first embodiment has improved Q values in the frequency range between the resonance frequency fr and the anti-resonance frequency fa, as compared with the first comparative example. For example, the Q value of the first comparative example decreases considerably near the resonance frequency fr, while such a decrease does not occur in the first embodiment.

It is seen from the results illustrated in FIGS. 7 and 8 that the additional films 18 result in an effect of confining the acoustic waves and that the radiation conductance is reduced and the Q values are improved in the range between the resonance frequency fr and the anti-resonance frequency fa.

Figure 9A:
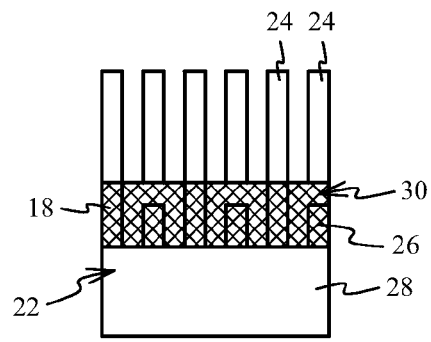
FIGS. 9A through 9C are schematic top views of SAW devices in accordance with first through third variations of the first embodiment.
Figure 9B:
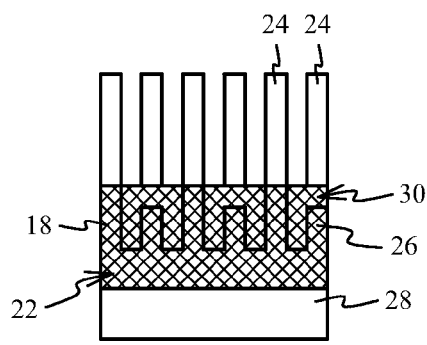
Figure 9C:
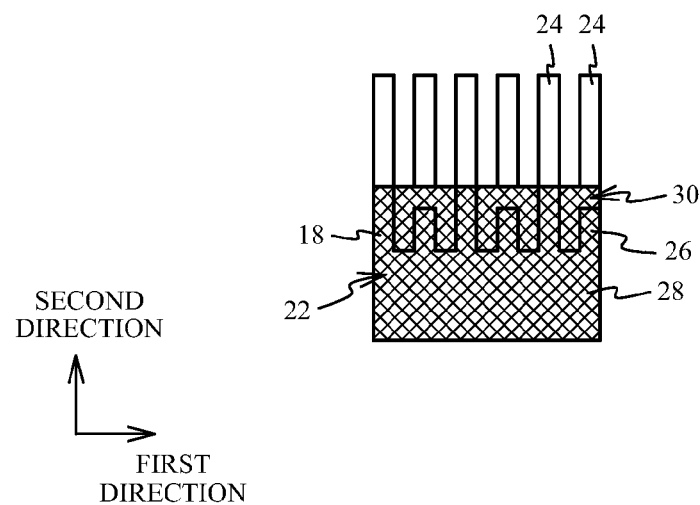

The inventors conducted an experiment intended to confirm whether there is a relation between the shapes of the additional films 18 and the Q characteristic. In this experiment, first through third variations of the first embodiment were prepared. FIGS. 9A through 9C are top views of SAW devices in accordance with the first through third variations of the first embodiment, respectively. Although FIGS. 9A through 9C illustrate only part of the comb-like electrodes 22 and the additional film 18, the other structures are the same as those of the first embodiment illustrated in FIGS. 1A and 1B. Referring to FIG. 9A, the first variation is configured to have the additional film 18 that covers the whole gaps 30 and the whole dummy electrode fingers 26. Referring to FIG. 9B, the additional film 18 of the second variation fully covers the whole gaps 30 and the whole dummy electrode fingers 26 and covers only part of the bus bar 28. Referring to FIG. 9C, the additional film 18 of the third variation covers the whole gaps 30, the whole dummy electrode fingers 26 and the whole bus bar 28. The SAW devices of the first through third comparative examples employ the additional films 18 that is made of Ta$_2$O$_5$ and is 24 nm thick, and the other parameter values are the same as those described in Table 1.

Figure 10:
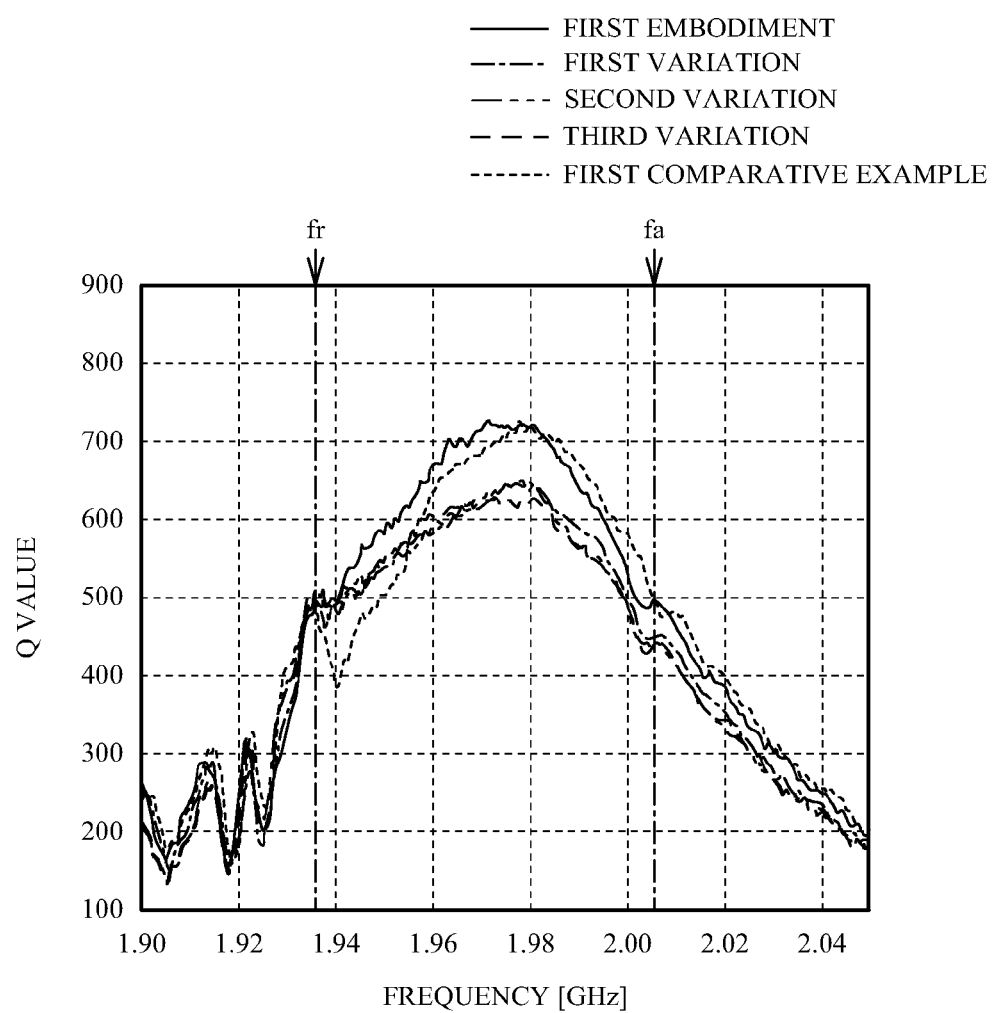
FIG. 10 is a graph of measurement results of the Q characteristics of the first embodiment and the first through third variations thereof.

FIG. 10 illustrates measurement results of the Q characteristics of the first embodiment and the first through third variations thereof. The measurement results of the first embodiment and the first through third variations thereof are indicated by a solid line, a one-dotted chain line, a two-dotted chain line and a broken line, respectively. For the purpose of comparison, FIG. 10 illustrates a measurement result of the SAW device of the first comparative example that does not have the additional films 18. A dotted line is used to indicate the measurement result of the first comparative example. As illustrated in FIG. 10, the first embodiment has the highest Q value. This result suggests that the additional films 18 having parts provided in areas other than the gaps 30 weakens the effect of confining the acoustic waves. Further, the first through third variations with the additional films 18 that are made of Ta$_2$O$_5$ and is 24 nm in thickness have smaller Q values than those of the first comparative example.

Figure 11:
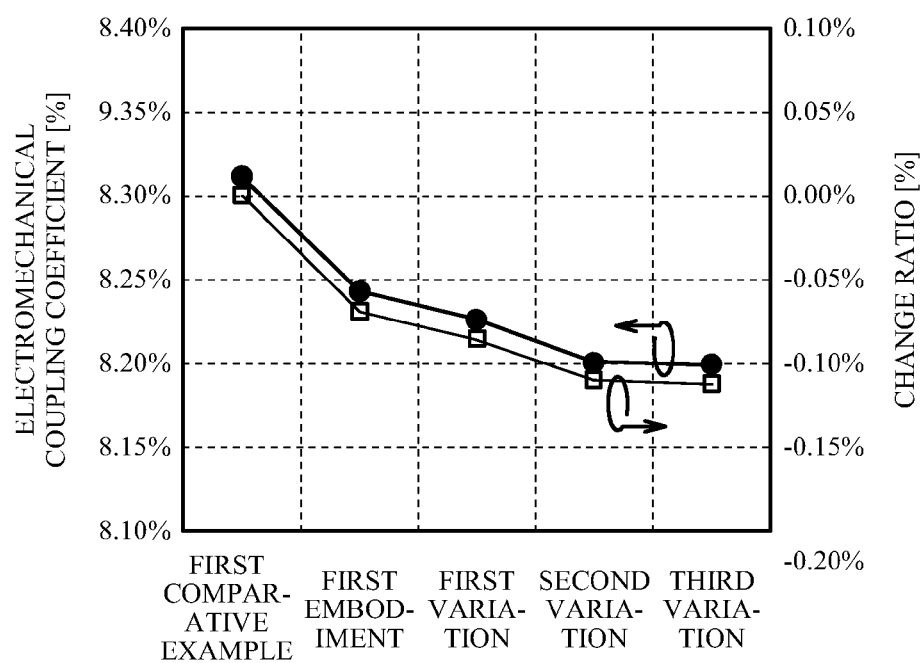
FIG. 11 is a graph of measurement results of the electromechanical coupling coefficients of the first embodiment and the first through third variations thereof.

FIG. 11 illustrates measurement results of the electromechanical coupling coefficients of the first embodiment and the first through third variations thereof. The left-side vertical axis indicates measurement results of the electromechanical coupling coefficients, and the right-side vertical axis indicates percentages of changes in the electromechanical coupling coefficients of the first embodiment and the first through third variations to the electromechanical coupling coefficient of the first comparative example. FIG. 11 shows that all of the first embodiment and the first through third variations have smaller values of the electromechanical coupling coefficients than that of the first comparative example. Further, it is seen from FIG. 11 that the electromechanical coupling coefficients of the first embodiment and the first through third variations are decreasing in this order. It is considered that the additional films 18 that do not contribute the propagation of acoustic wave energy provided in wider areas result in smaller values of the electromechanical coupling coefficients of the SAW devices.

Figure 12:
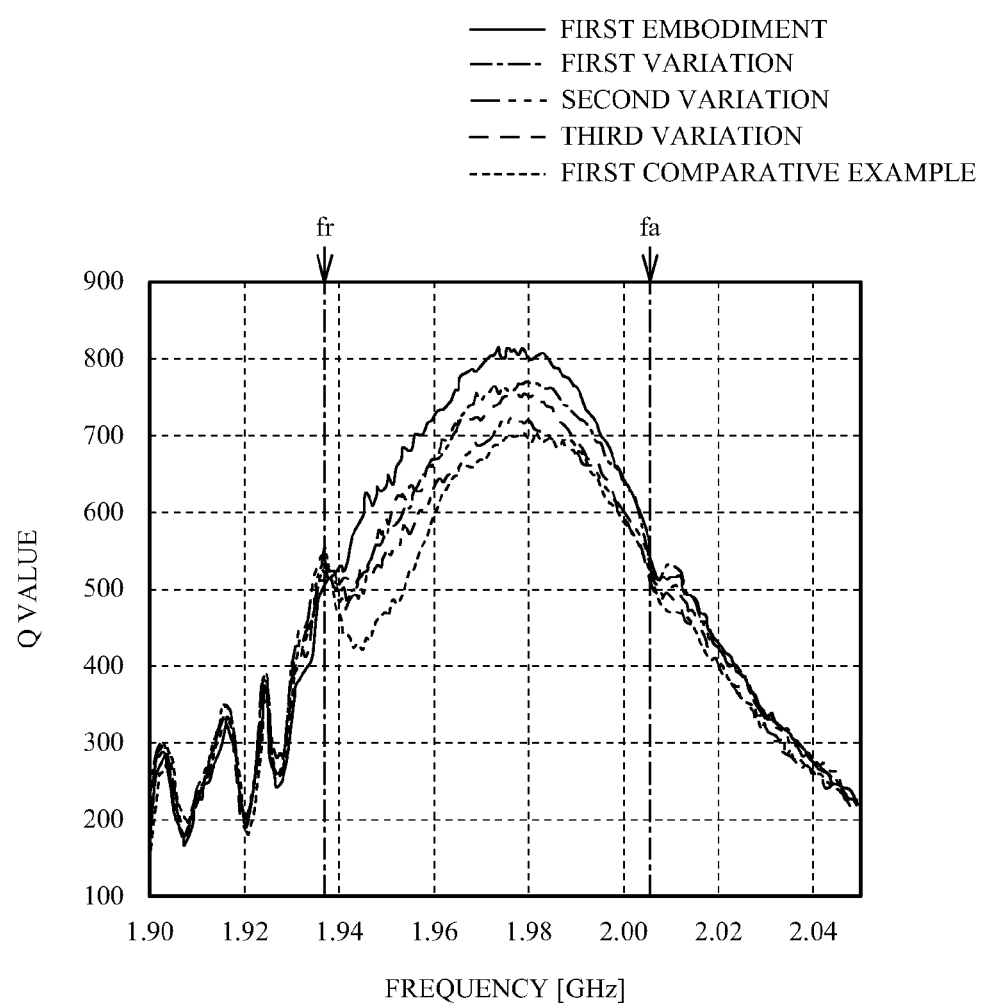
FIG. 12 is a graph of measurement results of the Q characteristic of the first embodiment and the first through third variations observed when the thickness of additional films is optimized.

The inventors conducted an experiment directed to obtaining the most suitable thickness of the additional films 18 that results in the largest Q value in each of the first embodiment and the first through third variations. The largest Q value is obtained in the first embodiment when the $Ta_2O_5$ film has a thickness of 6 nm, while the largest Q values are obtained in the first through third variations when the $Ta_2O_5$ film has a thickness of 4 nm. FIG. 12 illustrates measurement results of the Q characteristics of the first embodiment and the first through third variations thereof with the additional films having the respective most suitable thicknesses. It is seen from FIG. 12 that the optimization of the thickness of the additional films 18 improves the Q values in all of the first embodiment and the first through third variations thereof in the range of the resonance frequency fr to the anti-resonance frequency fa, as compared with the first comparative example. The Q value of the first embodiment is the largest, and the first variation has the second largest Q value.

It is understood from FIGS. 10 and 12 that it is preferable that the additional films 18 do not greatly extend from the gaps 30 in the second direction from the viewpoint of obtaining increased Q values due to the effect of confining the acoustic waves. Therefore, the inventors conducted an experiment intended to investigate a relation between the overlap length (previously described with reference to FIG. 6) and the Q value and another relation between the overlap length and the electromechanical coupling coefficient. In the experiment, the first embodiment and fourth through seventh variations were prepared. Both the overlap length of the additional films 18 that extends towards the electrode fingers 24 and the overlap length that extends towards the dummy electrode fingers 26 are 0.0λ, 0.1λ, 0.2λ, 0.4λ and 0.6λ in the first embodiment and the fourth through seventh variations, respectively. Further, the first variation of the first embodiment illustrated in FIG. 9A was also prepared. The additional films 18 used in the present experiment is made of $Ta_2O_5$ and is 24 nm in thickness. The other parameter values of the SAW devices used in the experiment are the same as illustrated in Table 1. In the experiment, the Q characteristics and the electromechanical coupling coefficients of the samples were measured.

Figure 13:
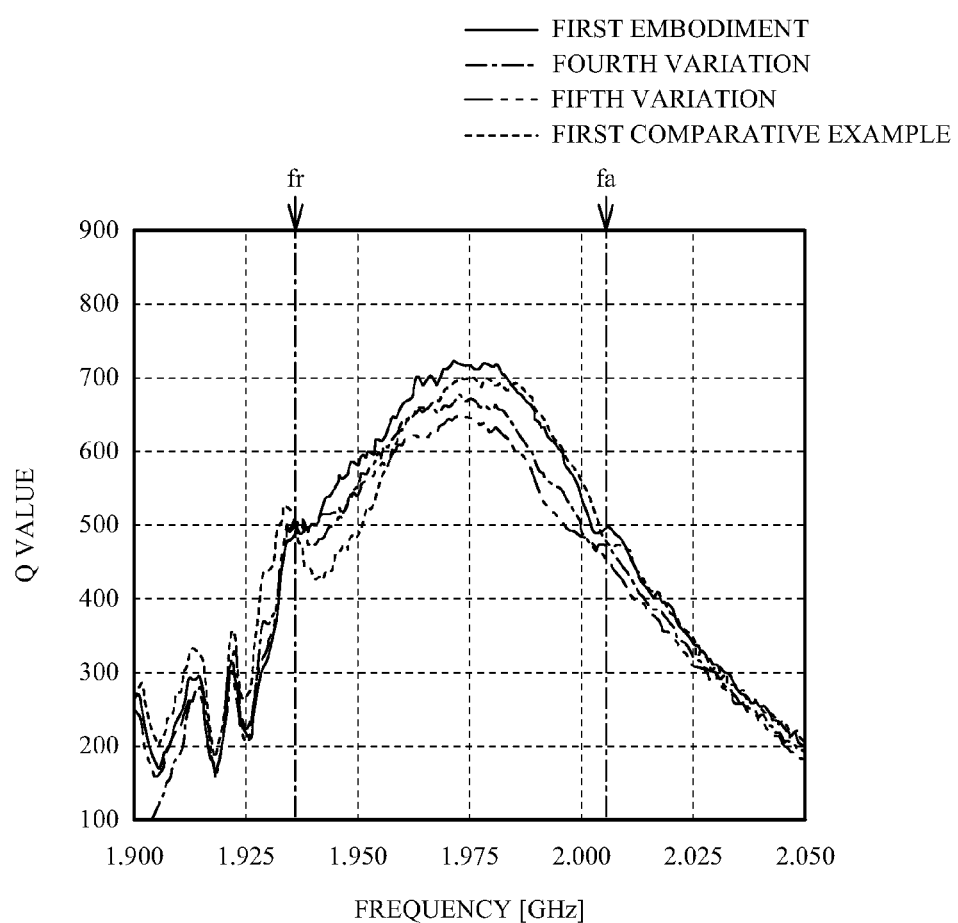
FIG. 13 is a graph of measurement results of the Q characteristics of the first embodiment and fourth and fifth variations thereof.

FIG. 13 illustrates measurement results of the Q characteristics of the SAW devices according to the first embodiment and the fourth and fifth variations thereof. The measurement results of the first embodiment and the fourth and fifth variations are indicated by a solid line, a one-dotted chain line and a two-dotted chain line, respectively. For the purpose of comparison, the experiment was further conducted for the SAW device of the first comparative example having the same structure except that the additional films 18 are not used. A measurement result of the first comparative example is indicated by a dotted line. As illustrated in FIG. 13, the Q values of the first embodiment, the fourth variation and the fifth variation are decreasing in this order in the range between the resonance frequency fr and the anti-resonance frequency fa. It is thus confirmed that the Q value decreases as the overlap length increases (as the additional films 18 extend more in the second direction).

Table 2 illustrates measurement results of the electromechanical coupling coefficients of the SAW devices according to the first comparative example, the first embodiment, the fourth through seventh variations of the first embodiment, and the first variation of the first embodiment. It is seen from Table 2 that all of the first embodiment, the fourth through seventh variations and the first variation have smaller values of the electromechanical coupling coefficients than that of the first comparative example, and that the electromechanical coupling coefficients of the first embodiment, the first variation, and the fourth through seventh variations are decreasing in this order. That is, as the overlap length increases, the electromechanical coupling coefficient decreases. The electromechanical coupling coefficient of the fifth variation with an overlap length of 0.2λ decreases by around 0.25% with respect to the first comparative example. A decrease as small as around 0.25% hardly affects the filter performance. However, if a decrease is as large as 0.5% or more, it will be concerned that the bandwidth of the filter becomes narrow or mismatch loss increases due to deterioration of the impedance matching in the center of the band. According to Table 2, the overlap length that results in only a decrease of 0.5% or less in the electromechanical coupling coefficient is equal to or less than 0.4λ. The overlap length is preferably not more than 0.4λ and more preferably not more than 0.2λ, and is much more preferably not more than 0.1λ. Although the first variation has the additional films 18 that cover the dummy electrode fingers 26 as illustrated in FIG. 9A, only a very small decrease in the electromechanical coupling coefficient takes place. The overlap of the additional films 18 on the side where the dummy electrode fingers 26 exist prevents improvement in the Q value but does not deteriorate the electromechanical coupling coefficient greatly. The deterioration of the electromechanical coupling coefficient is more affected by the overlap on the side where the electrode fingers 24 exist than by the overlap on the side where the dummy electrode fingers 26 exist. Therefore, the overlap length is preferably not more than 0.4λ and more preferably not more than 0.2λ, and is much more preferably not more than 0.1λ.

TABLE 2

|  | Overlap length [λ] | $K^2$ [%] | $K^2$ decrease ratio [%] |
|---|---|---|---|
| $1^{st}$ comparative example | — | 8.31 | 0.00 |
| $1^{st}$ embodiment | 0.0 | 8.24 | −0.07 |
| $4^{th}$ variation | 0.1 | 8.14 | −0.17 |
| $5^{th}$ variation | 0.2 | 8.06 | −0.25 |
| $6^{th}$ variation | 0.4 | 7.85 | −0.46 |
| $7^{th}$ variation | 0.6 | 7.60 | −0.71 |
| $1^{st}$ variation | — | 8.23 | −0.09 |

As described above, according to the first embodiment and its variations, the additional films 18 that have a strip shape and extend in the first direction are provided so as to cover the gaps 30 formed by the electrode fingers 24 of one of the pair of the comb-like electrodes 22 and the dummy electrode fingers 26 of the other comb-like electrode 22. It is thus possible to reduce the radiation conductance and improve the Q value in the range of the resonance frequency fr to the anti-resonance frequency fa. Thus, a filter to which the present SAW device is applied has improved insertion loss.

It is preferable that the additional films 18 do not greatly extend from the gaps 30 in the second direction from the viewpoint of improving the Q value due to the effect of confining the acoustic waves. When the additional films 18 are not provided widely, the influence of frequency deviations are reduced. For example, as illustrated in FIG. 9A, it is preferable that the additional films 18 extend, in the form of a strip, within the range from the ends of the electrode fingers 24 of one of the pair of comb-like electrodes 22 to the ends of the dummy electrode fingers 26 of the other comb-like electrode 22 connected to the bus bars 28 in the second direction. With this structure, the deterioration of the electromechanical coupling coefficient is suppressed and the Q value is improved, as indicated in Table 2 and FIG. 12.

As described previously with reference to Table 2, it is preferable that the overlap length is equal to or smaller than 0.4λ from the viewpoint of suppressing the deterioration of the electromechanical coupling coefficient and improving the Q value. It is therefore preferable that the additional films 18 extend, in the form of a strip, within the range between the position of 0.4λ from the ends of the electrode fingers 24 and the position of 0.4λ from the ends of the dummy electrode fingers 26 located at the opposite sides of the gaps in the second direction, and cover at least either the electrode fingers 24 or the dummy electrode fingers 26. It is more preferable that the additional films 18 extend, in the form of a strip, within the range between the position of 0.2λ from the ends of the electrode fingers 24 and the position of 0.2λ from the ends of the dummy electrode fingers 26 in the second direction, and cover at least either the electrode fingers 24 or the dummy electrode fingers 26. It is much more preferable that the additional films 18 extend, in the form of a strip, within the range between the position of 0.1λ from the ends of the electrode fingers 24 and the position of 0.1λ from the ends of the dummy electrode fingers 26 in the second direction, and cover at least either the electrode fingers 24 or the dummy electrode fingers 26.

Figure 14A:
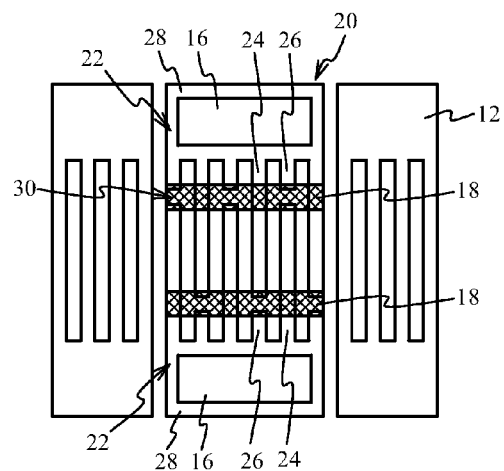
FIGS. 14A through 14C are schematic top views of SAW devices in accordance with eighth through tenth variations of the first embodiment.
Figure 14B:
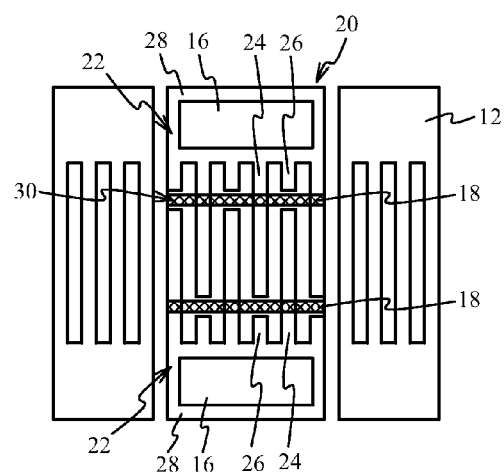
Figure 14C:
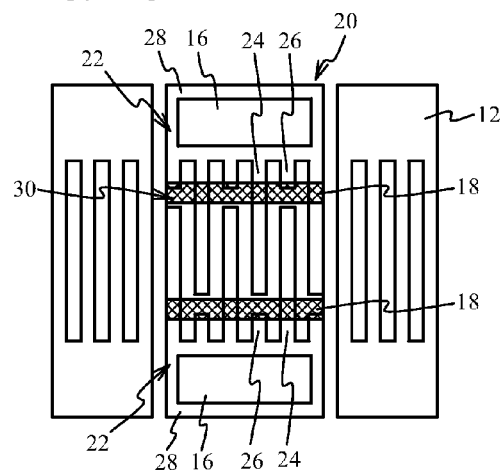
Figure 14C:
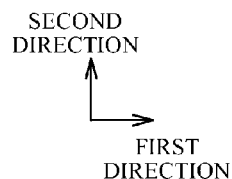

The additional films 18 may be arranged as illustrated in FIGS. 14A through 14C, which are top views of SAW devices in accordance with eighth through tenth variations of the first embodiment. As illustrated in FIGS. 14A and 14C, the additional films 18 may extend in the form of a strip so as to overlap with at least either the electrode fingers 24 or the dummy electrode fingers 26 located at the opposite sides of the gaps 30 in the second direction. As illustrated in FIGS. 14B and 14C, the additional films 18 may extend in the form of a strip so as to be spaced apart from at least either the ends of the electrode fingers 24 or those of the dummy electrode fingers 26 located at the opposite sides of the gaps 30 in the second direction. In this case, the spaces are preferably equal to or smaller than 0.4λ, and are more preferably equal to or smaller than 0.3λ. It is much more preferable that the spaces are not greater than 0.2λ. The additional films 18 cover at least parts of the gaps 30 and extend in the first direction.

Figure 15A:
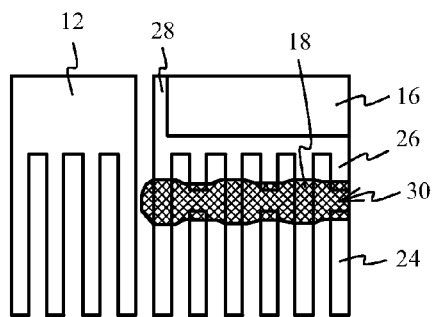
FIGS. 15A through 15E are schematic top views of SAW devices of the eighth embodiment actually fabricated.
Figure 15B:
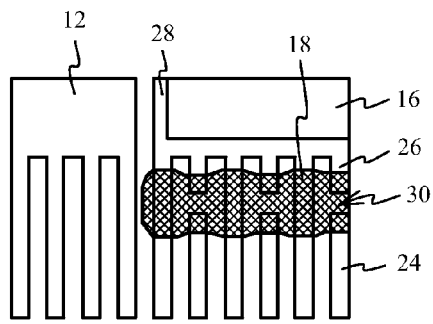
Figure 15B:
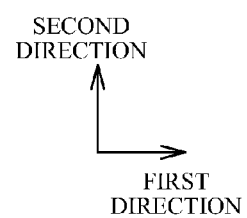
Figure 15C:
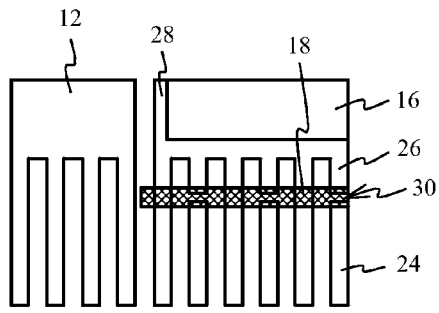
Figure 15D:
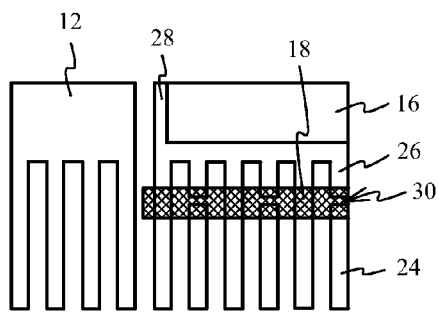
Figure 15E:
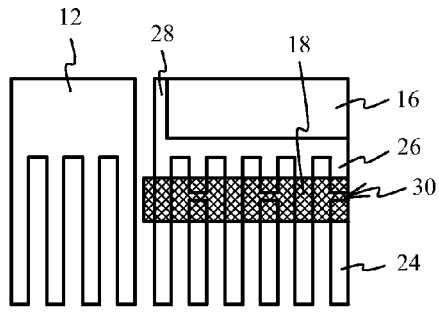

FIGS. 15A through 15E are schematic top views of SAW devices according to the eighth embodiment of the first embodiment actually fabricated. It is to be noted that FIGS. 15A through 15E illustrate only a part of the SAW device. As illustrated in FIGS. 15A and 15B, in some SAW devices, the additional films 18 have parts that are formed on the electrode fingers 24 located next to the gaps 30 in the first direction and are wider than parts formed on the gaps 30. In contrast, as illustrated in FIGS. 15C through 15E, there are SAW devices having the additional films 18 that have almost constant widths along the lengths thereof. A similar arrangement of the additional films 18 takes place even when the additional films 18 do not overlap with the electrode fingers 24 and the dummy electrode fingers 26 located at the opposite sides of the gaps 30 in the second direction.

Figure 16A:
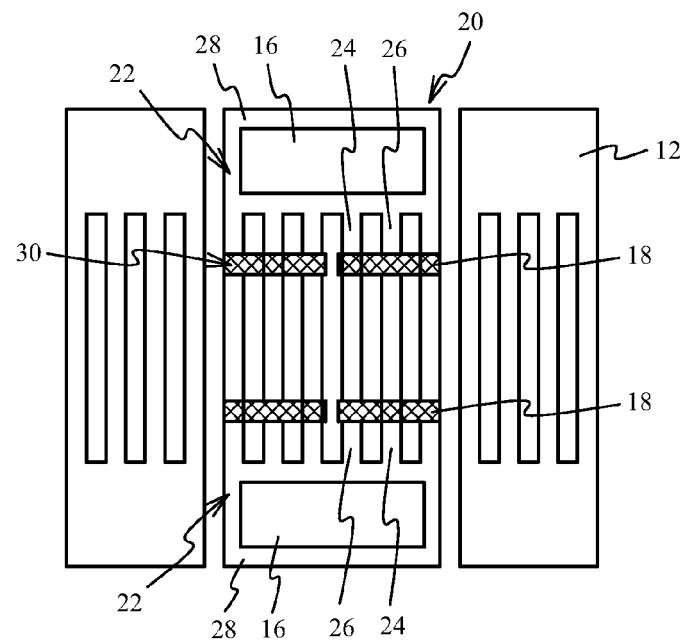
FIGS. 16A and 16B are top views of SAW devices in accordance with eleventh and twelfth variations of the first embodiment.
Figure 16B:
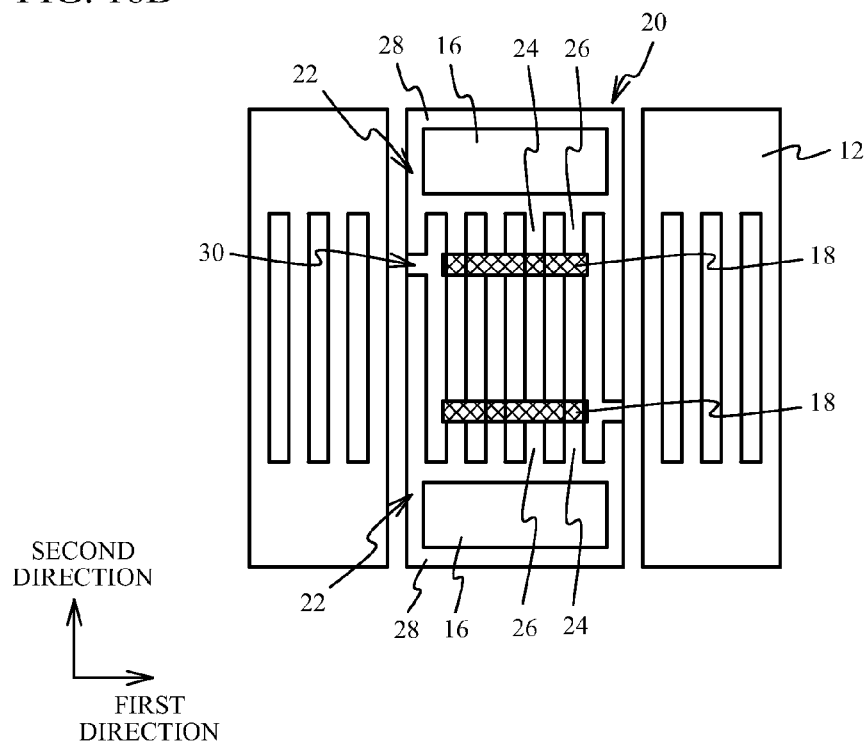

As illustrated in FIGS. 1A and 1B, the additional films 18 are preferably arranged to extend from the outermost electrode finger 24 of one of the pair of comb-like electrodes 22 to the outermost electrode finger 24 of the other from the viewpoint of confining the acoustic waves. Besides, the additional films 18 may be arranged as illustrated in FIGS. 16A and 16B, which are top views of SAW devices in accordance with eleventh and twelfth variations of the first embodiment. As illustrated in FIG. 16A, the additional films 18 are divided into two or more. In the case of FIG. 16A, each of the additional films 18 is divided into two in the center thereof in the first direction. As illustrated in FIG. 16B, each of the additional films 18 is provided so as to extend over at least two gaps 30 in the center of the pair of comb-like electrodes 22.

Second Embodiment

Figure 17A:
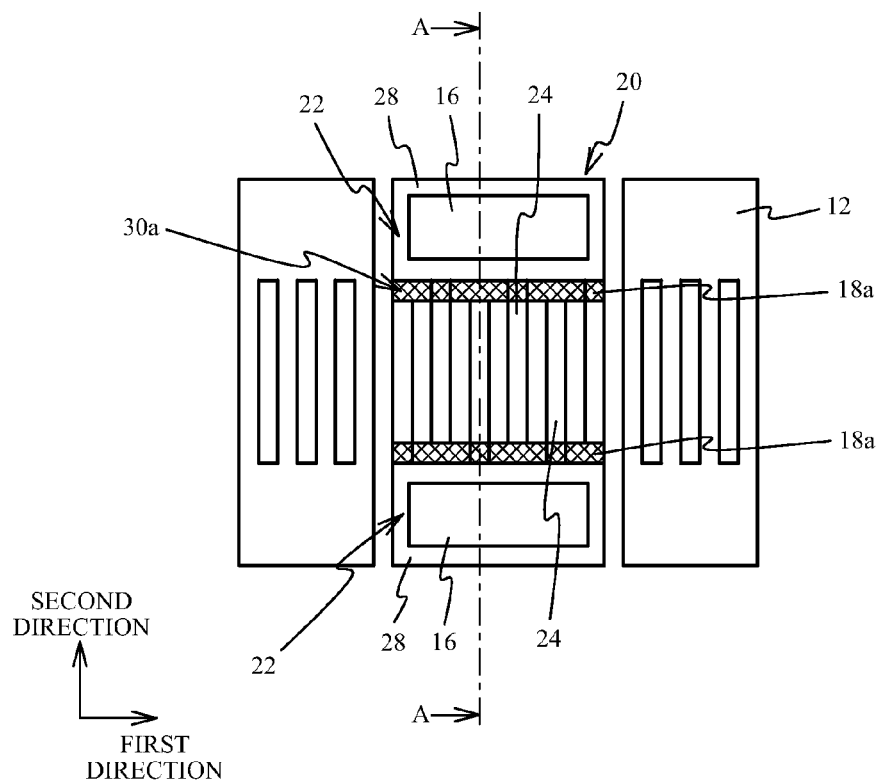
FIG. 17A is a top view of a SAW device in accordance with a second embodiment.
Figure 17B:
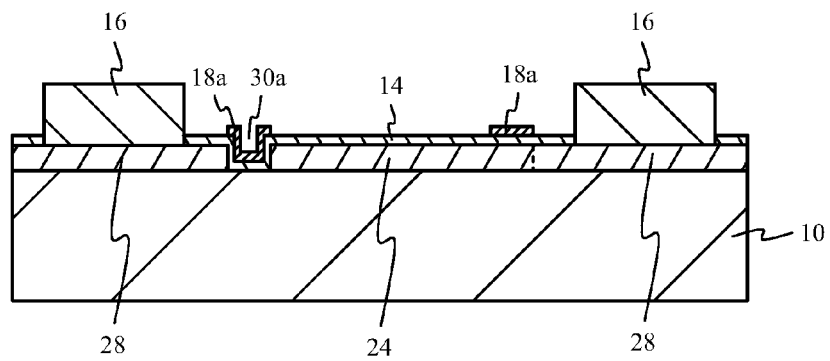
FIG. 17B is a cross-sectional view taken along a line A-A in FIG. 17A.

A second embodiment has an exemplary structure in which the dummy electrode fingers 26 are not used. FIG. 17A is a top view of a SAW device of the second embodiment, and FIG. 17B is a cross-sectional view taken along a line A-A in FIG. 17A. The view of FIG. 17A is seen through the protective film 14. Referring to FIGS. 17A and 17B, the dummy electrode fingers 26 are not provided but the electrode fingers 24 of one of the pair of comb-like electrodes 22 face the bus bar 28 of the other comb-like electrode 22. Gaps 30a are formed between the ends of the electrode fingers 24 of one of the comb-like electrodes 22 and side parts of the bus bar 28 of the other comb-like electrode 22 that face the above ends. Additional films 18a extend in the first direction in the form of a strip while covering at least parts of the gaps 30a. Other structures of the second embodiment are similar to those of the first embodiment illustrated in FIGS. 1A and 1B.

Even when the dummy electrode fingers 26 are not used as in the case of the second embodiment, the additional films 18 are provided so as to cover at least parts of the gaps 30a formed between the ends of the electrode fingers 24 of one of the comb-like electrodes 22 and the side parts of the bus bar 28 of the other comb-like electrode 22 that faces the above ends and to extend in the form of a strip in the first direction. It is thus possible to reduce the radiation conductance and improve the Q value. A filter to which the SAW device of the second embodiment is applied has improved insertion loss.

Like the first embodiment, the second embodiment is preferably configured so that the additional films 18a extend, in the form of a strip, within the range between the position of 0.4λ from the ends of the electrode fingers 24 and the position of 0.4λ from the side of the bus bar 28, which positions are located at the opposite sides of the gaps 30a in the second direction, and cover at least either the electrode fingers 24 or the bus bar 28. The additional films 18a are more preferably arranged to extend, in the form of a strip, within the range between the position of 0.2λ from the ends of the electrode fingers 24 and the position of 0.2λ from the side of the bus bar 28 and to cover at least either the electrode fingers 24 or the bus bar 28, and is much more preferably arranged to extend, in the form of a strip, within the range between the position of 0.1λ from the ends of the electrode fingers 24 and the position of 0.1λ from the side of the bus bar 28 and to cover at least either the electrode fingers 24 or the bus bar 28. In similar ways to those depicted in FIGS. 14A through 14C, the additional films 18a may be arranged to extend in the form of a strip so as to overlap with at least either the electrode fingers 24 or the bus bar 28 located at the opposite sides of the gaps 30*a*, or may be arranged to extend in the form of a strip so as to be spaced apart from at least either the electrode fingers 24 or the bus bar 28. Besides, as depicted in FIGS. 16A and 16B, the additional films 18*a* may be divided into parts or may extend over at least two gaps 30*a* in the center portion of the pair of comb-like electrodes 22.

Third Embodiment

Figure 18:
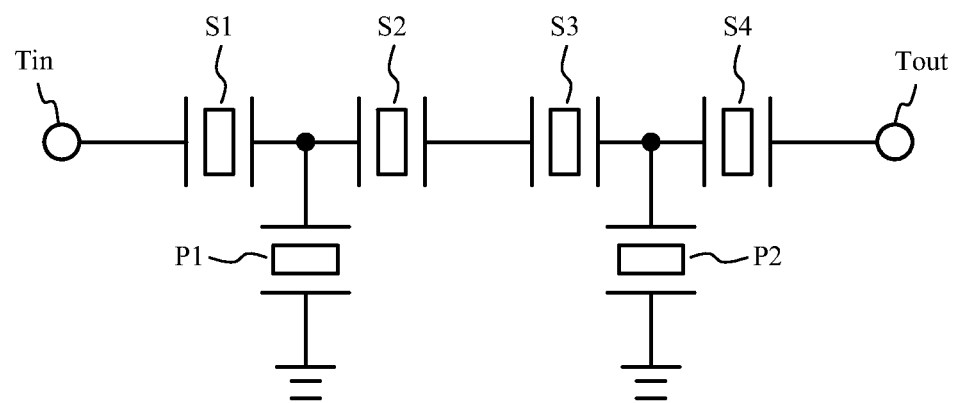
FIG. 18 is a circuit diagram of a ladder filter in accordance with a third embodiment.

A third embodiment has an exemplary structure in which the SAW device of the first embodiment is applied to a filter. FIG. 18 is a circuit diagram of a ladder filter in accordance with the third embodiment. Referring to FIG. 18, the ladder filter includes series resonators S1~S4 connected in series between an input terminal Tin and an output terminal Tout, and parallel resonators P1 and P2 connected in parallel between the input terminal Tin and the output terminal Tout. At least one of the series resonators S1~S4 and the parallel resonators P1 and P2 may be the SAW resonator of the first embodiment. However, the following description is given of a case where the SAW device of the first embodiment is applied to each of the series resonators S1~S4.

A description is now given of an experiment conducted by the inventors. In the experiment, the following ladder filter configured in accordance with the third embodiment was prepared. More specifically, the SAW device of the first embodiment having the parameter values indicated in Table 1 is applied to each of the series resonators S1~S4, while the parallel resonators P1 and P2 is configured according to Table 1 except that the parallel resonators P1 and P2 do not have the additional films 18 and the IDT is composed of 80 pairs of electrode fingers 24. The band-pass characteristic and the reflection characteristic of the ladder filter were measured. For the purpose of comparison, a second comparative example was prepared and measured similarly in which the second comparative example is the same as the ladder filter of the third embodiment except that the second comparative example has the series resonators S1 ~S4 having no additional films 18.

Figure 19A:
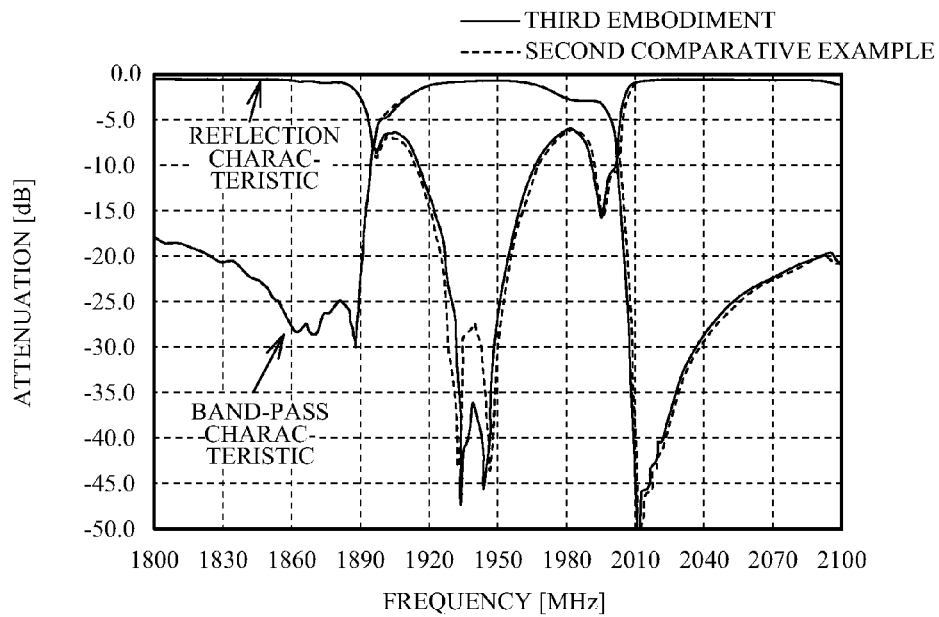
FIG. 19A is a graph of measurement results of the band-pass characteristic and the reflection characteristic of the ladder filter of the third embodiment.
Figure 19B:
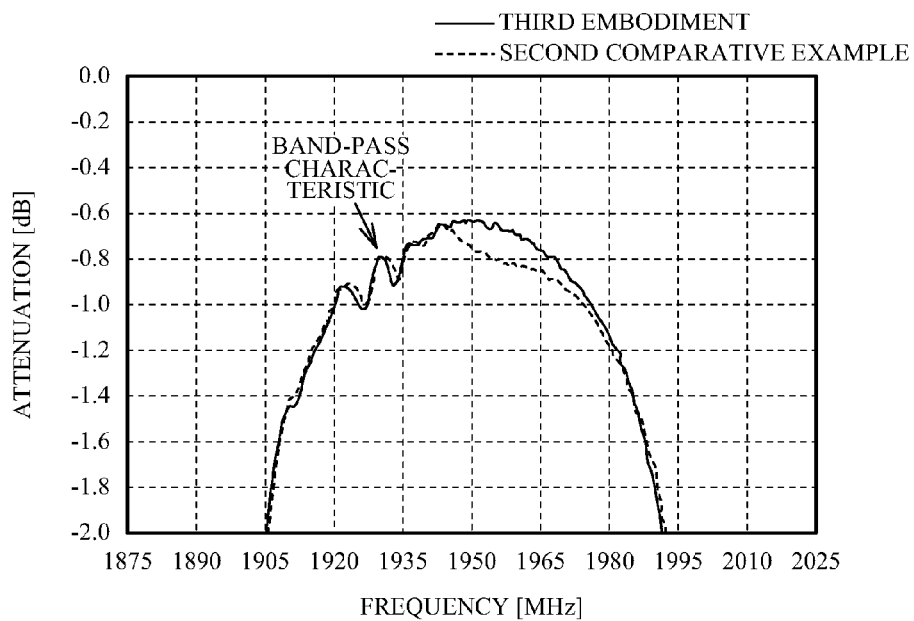
FIG. 19B is an enlarged view of the band-pass characteristic of FIG. 19A in a pass band.

FIG. 19A illustrates measurement results of the band-pass characteristics and the reflection characteristics of the third embodiment and the second comparative example. FIG. 19B is an enlarged view of the band-pass characteristics in the pass bands in FIG. 19A. In FIG. 19B, since the return loss affects the insertion loss, there is illustrated a band-pass characteristic with the return loss being set equal to 0 (no influence of the return loss). A solid line indicates the measurement result of the third embodiment, and a broken line indicates the measurement result of the second comparative example. It is seen from FIG. 19A that the third embodiment has only a small change in the band-pass characteristic because of the use of the additional films 18, as compared with the second comparative example. It is seen from FIG. 19B that the insertion loss of the third embodiment in the pass band is improved as compared with the second comparative example. Thus, the insertion loss of the ladder filter is reduced by using the SAW devices with the additional films 18.

The filter having the SAW device with the additional films 18 according to the first embodiment has improved insertion loss. Decrease in the electromechanical coupling coefficient of the resonator caused by the additional films 18 is suppressed by controlling the overlap length. Thus, there is little difference in the band-pass characteristic and the suppression characteristic outside of the pass band between the third embodiment and the second comparative example. It is thus possible to improve the insertion loss by merely adding the additional films 18 without changing the design of the structure that has been completed without using the additional films 18. The third embodiment may be varied so that the SAW device of the first embodiment is applied to the parallel resonators P1 and P2 as well as the series resonators S1~S4. In the third embodiment, the SAW device of the first embodiment is applied to only the series resonators S1~S4, so that the insertion loss on the high-frequency side having the frequencies higher than the frequency in the center of the pass band is improved, as illustrated in FIG. 19*b*. If the SAW device of the first embodiment is applied to the parallel resonators P1 and P2, the insertion loss will be improved on the low-frequency side having the frequencies lower than the center frequency. This is because the SAW device of the first embodiment has the improved Q values within the whole range between the resonance frequency fr and the anti-resonance frequency fa, as illustrated in FIG. 8, for example.

Figure 20A:
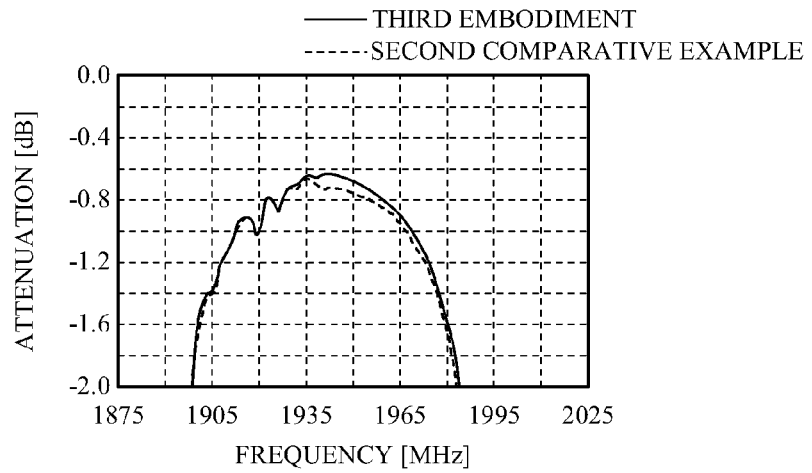
FIGS. 20A through 20C are graphs of measurement results of the band-pass characteristics of SAW devices fabricated by first through third methods, respectively.
Figure 20B:
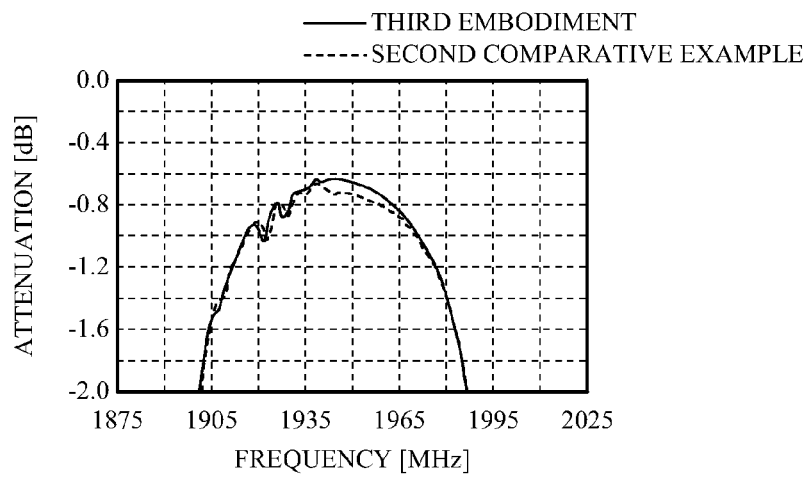
Figure 20C:
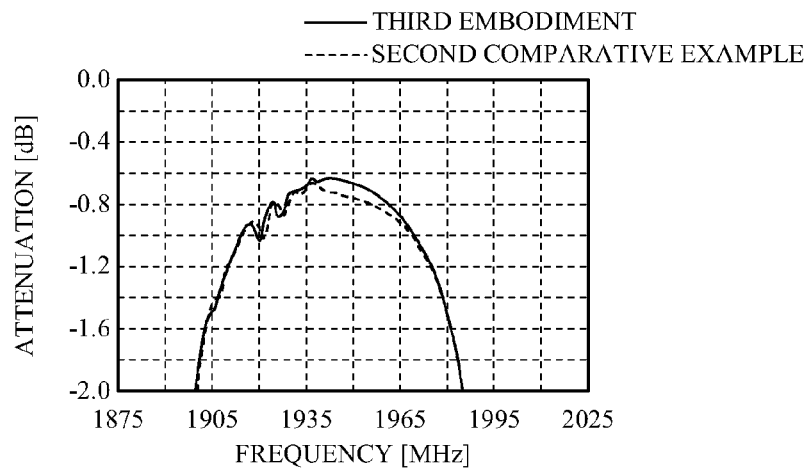

The three methods for fabricating the SAW device of the first embodiment have been described with reference to FIGS. 2A through 5C. In order to confirm the improvement in the insertion loss that is achieved whichever any of the first through third methods is used, SAW devices of the first embodiment fabricated by the first through third fabrication methods were applied to the series resonators S1~S4, and the band-pass characteristics and the reflection characteristics thereof were measured. FIGS. 20A through 20C illustrate measurement results of the band-pass characteristics of the ladder filters with the SAW devices fabricated by the first through third fabrication methods, respectively. In the graphs of FIGS. 20A through 20C are illustrated with the return loss being set equal to 0 as in the case of FIG. 19B. It is seen from FIGS. 20A through 20C that similar improvements in the insertion loss are achieved in the first through third fabrication methods.

The third embodiment may be changed so that at least one of the series resonators S1 ~S4 and the parallel resonators P1 and P2 is formed by the SAW device of any of the first embodiment, the variations thereof and the second embodiment. The third embodiment is not limited to the ladder filter but includes another type of filer such as a multi-mode filter having the gaps 30.

The present invention is not limited to the specifically described embodiments and variations but includes other embodiments and variations thereof within the scope of the claimed invention.

What is claimed is:

1. A surface acoustic wave device comprising:
a pair of comb-like electrodes formed on a piezoelectric substrate, each of the pair of comb-like electrodes includes electrode fingers, dummy electrode fingers and a bus bar to which the electrode fingers and the dummy electrode fingers are connected, the electrode fingers and the dummy electrode fingers of one of the pair of comb-like electrodes facing the dummy electrode fingers and the electrode fingers of the other of the pair of comb-like electrodes, respectively; and
additional films extending in the form of a strip in a first direction in which the electrode fingers of the pair of comb-like electrodes are arranged side by side, each of the additional films covering at least parts of gaps defined by ends of the electrode fingers of one of the pair of comb-like electrodes and ends of the dummy electrode fingers of the other of the pair of comb-like electrodes.

2. The surface acoustic wave device according to claim 1, wherein each of the additional films extends within a range between the ends of the electrode fingers of the one of the pair of comb-like electrodes and ends of the dummy electrode fingers of the other of the pair of comb-like electrodes connected to the bus bar in a second direction in which each of the electrode fingers of the pair of comb-like electrodes extend.

3. The surface acoustic wave device according to claim 1, wherein each of the additional films extends within a range between a position of 0.4λ from the ends of the electrode fingers of the one of the pair of comb-like electrodes and a position of 0.4λ from the ends of the dummy electrode fingers of the other of the pair of comb-like electrodes located at opposite sides of the gaps in a second direction in which each of the electrode fingers of the pair of comb-like electrodes extend, and cover at least either the electrode fingers or the dummy electrode fingers where λ is a wavelength of acoustic waves excited by the pair of comb-like electrodes.

4. The surface acoustic wave device according to claim 1, wherein each of the additional films are spaced apart from at least either the ends of the electrode fingers of the one of the pair of comb-like electrodes or the ends of the dummy electrode fingers of the other of the pair of comb-like electrodes located at opposite sides of the gaps in a second direction in which each of the electrode fingers of the pair of comb-like electrodes extend.

5. The surface acoustic wave device according to claim 1, further comprising a protective film covering the pair of comb-like electrodes, wherein the additional films are provided on the protective film.

6. The surface acoustic wave device according to claim 1, wherein the additional films include any of tantalum oxide, aluminum oxide, silicon oxide, silicon nitride, aluminum nitride, silicon carbide, titanium oxide, silicon, diamond and a metal film.

7. A surface acoustic wave device comprising:
a pair of comb-like electrodes formed on a piezoelectric substrate, each of the pair of comb-like electrodes includes electrode fingers and a bus bar to which the electrode fingers are connected and does not include dummy electrode fingers, the electrode fingers of one of the pair of comb-like electrodes facing the bus bar of the other of the pair of comb-like electrodes; and
additional films extending in the form of a strip in a first direction in which the electrode fingers of the pair of comb-like electrodes are arranged side by side, each of the additional films covering at least parts of gaps defined by ends of the electrode fingers of one of the pair of comb-like electrodes and a side of the bus bar of the other of the pair of comb-like electrodes.

8. The surface acoustic wave device according to claim 7, wherein each of the additional films extends within a range between a position of 0.4λ from the ends of the electrode fingers of the one of the pair of comb-like electrodes and a position of 0.4λ from the side of the bus bar of the other of the pair of comb-like electrodes located at opposite sides of the gaps in a second direction in which each of the electrode fingers of the pair of comb-like electrodes extend, and cover at least either the electrode fingers or the bus bar where λ is a wavelength of acoustic waves excited by the pair of comb-like electrodes.

9. The surface acoustic wave device according to claim 7, wherein each of the additional films are spaced apart from at least either the ends of the electrode fingers of the one of the pair of comb-like electrodes or the side of the bus bar of the other of the pair of comb-like electrodes located at opposite sides of the gaps in a second direction in which each of the electrode fingers of the pair of comb-like electrodes extend.

10. The surface acoustic wave device according to claim 7, further comprising a protective film covering the pair of comb-like electrodes, wherein the additional films are provided on the protective film.

11. The surface acoustic wave device according to claim 7, wherein the additional films include any of tantalum oxide, aluminum oxide, silicon oxide, silicon nitride, aluminum nitride, silicon carbide, titanium oxide, silicon, diamond and a metal film.

12. A filter comprising resonators connected between an input terminal and an output terminal,
the resonators including a surface acoustic wave device including:
a pair of comb-like electrodes formed on a piezoelectric substrate, each of the pair of comb-like electrodes includes electrode fingers, dummy electrode fingers and a bus bar to which the electrode fingers and the dummy electrode fingers are connected, the electrode fingers and the dummy electrode fingers of one of the pair of comb-like electrodes facing the dummy electrode fingers and the electrode fingers of the other of the pair of comb-like electrodes, respectively; and
additional films extending in the form of a strip in a first direction in which the electrode fingers of the pair of comb-like electrodes are arranged side by side, each of the additional films covering at least parts of gaps defined by ends of the electrode fingers of one of the pair of comb-like electrodes and ends of the dummy electrode fingers of the other of the pair of comb-like electrodes.

13. A filter comprising resonators connected between an input terminal and an output terminal,
the resonators including a surface acoustic wave device including:
a pair of comb-like electrodes formed on a piezoelectric substrate, each of the pair of comb-like electrodes includes electrode fingers and a bus bar to which the electrode fingers are connected and does not include dummy electrode fingers, the electrode fingers of one of the pair of comb-like electrodes facing the bus bar of the other of the pair of comb-like electrodes; and
additional films extending in the form of a strip in a first direction in which the electrode fingers of the pair of comb-like electrodes are arranged side by side, each of the additional films covering at least parts of gaps defined by ends of the electrode fingers of one of the pair of comb-like electrodes and a side of the bus bar of the other of the pair of comb-like electrodes.

* * * * *